United States Patent
Yang (10) Patent No.: US 9,125,300 B2
(45) Date of Patent: Sep. 1, 2015

(54) ELECTRONIC DEVICE WITH HEAT SINK STRUCTURE

(71) Applicant: WISTRON CORP., New Taipei (TW)

(72) Inventor: Chun-Fei Yang, New Taipei (TW)

(73) Assignee: Wistron Corp., New Taipei (TW)

( * ) Notice: Subject to any disclaimer, the term of this patent is extended or adjusted under 35 U.S.C. 154(b) by 193 days.

(21) Appl. No.: 13/746,135

(22) Filed: Jan. 21, 2013

(65) Prior Publication Data

US 2013/0286589 A1   Oct. 31, 2013

(30) Foreign Application Priority Data

Apr. 27, 2012 (TW) .............................. 101115082 A (51) Int. Cl.
*G06F 1/20* (2006.01)
*H05K 1/02* (2006.01)
*F28F 3/02* (2006.01)

(52) U.S. Cl.
CPC ................ *H05K 1/0203* (2013.01); *F28F 3/02* (2013.01); *G06F 1/203* (2013.01)

(58) Field of Classification Search
CPC ............ G06F 1/20; G06F 1/203; G06F 1/206
USPC ............... 361/679.49, 679.48, 679.5, 679.51; 454/239, 256, 257, 258, 370
See application file for complete search history.

(56) References Cited

U.S. PATENT DOCUMENTS

| 6,115,252 | A  | * | 9/2000  | Ohta et al. ..................... 361/700 |
| 7,660,119 | B2 | * | 2/2010  | Iikubo ............................ 361/697 |
| 7,688,587 | B2 | * | 3/2010  | Ishikawa ........................ 361/695 |
| 8,059,410 | B2 | * | 11/2011 | Chen et al. .................... 361/719 |
| 8,102,649 | B2 | * | 1/2012  | Ma et al. .................. 361/679.47 |
| 8,218,313 | B2 | * | 7/2012  | Cheng et al. ............. 361/679.48 |

FOREIGN PATENT DOCUMENTS

| TW | M265680     |   | 5/2005 |
| TW | 200712846 A | * | 4/2007 |
| TW | M327130     |   | 2/2008 |
| TW | 200925835 A |   | 6/2008 |
| TW | I300894     |   | 9/2008 |

OTHER PUBLICATIONS

Taiwan Patent Office, Office Action, Patent Application Serial No. 101115082, Jul. 29, 2014, Taiwan.

* cited by examiner

*Primary Examiner* — Anthony Haughton (57) ABSTRACT

An electronic device includes a housing and a chip. The housing includes a main body and a supporting portion. The main body has an inner surface and an outer surface, and an opening disposed on the outer surface. The supporting portion is disposed on the inner surface, and has a heat dissipating chamber that communicates with the opening. The chip is disposed on the supporting portion, and the heat generated by the chip is transmitted via the housing.

21 Claims, 10 Drawing Sheets

ELECTRONIC DEVICE WITH HEAT SINK STRUCTURE

CROSS-REFERENCE TO RELATED APPLICATIONS

This Application claims priority of Taiwan Patent Application No. 101115082, filed on Apr. 27, 2012, the entirety of which is incorporated by reference herein.

BACKGROUND

1. Field of the Invention

The disclosure relates to an electronic device, and in particular to an electronic device including a housing for dissipating heat.

2. Description of the Related Art

In general, the efficiency of the notebook computer is higher, and the heat generated by the notebook is higher. Thus, the notebook with high efficiency includes fans and heat sink fins therein to dissipate the heat. However, the process of installing the fans and the heat sink fins into the notebook is very complex. Further, the fans and the heat sink fins need to be redesigned to correspond to the different configurations of different notebooks. Thus, the design time and the difficulty of the design of the electronic device increase.

In addition, since the heat generated by a chip of the notebook is only transmitted by the heat sink fins, and the fan and the heat sink fins are disposed in the notebook, the heat dissipating efficiency of the notebook is low.

BRIEF SUMMARY OF THE INVENTION

To solve the problems of the prior art, the objective of the present disclosure is to simplify the assembly of the electronic device, to decrease the design time and the difficulty of design of the electronic device, and to increase the heat dissipating efficiency of the electronic device.

For the above objective, the present invention provides a heat sink structure including a housing. The housing includes a main body and a supporting portion. The main body has an inner surface, an outer surface, and an opening disposed on the outer surface. The inner surface forms a receiving space. The supporting portion is disposed on the inner surface, and is located in the receiving space. The supporting portion has a heat dissipating chamber that communicates with the opening.

For the above objective, the present disclosure provides an electronic device including a housing, a circuit board and a chip. The housing includes a main body, a supporting portion and a plurality of heat sink fins. The main body has an inner surface, an outer surface and an opening disposed on the outer surface. The inner surface forms a receiving space. The supporting portion is disposed on the inner surface, and is located in the receiving space. The supporting portion has a heat dissipating chamber that communicates with the opening. The heat sink fins are disposed on the supporting portion, and are located in the heat dissipating chamber. The circuit board is disposed in the receiving space. The chip is disposed on the circuit board, and connected to the supporting portion. The main body, the supporting portion and the heat sink fins are formed as a single piece.

For the above objective, the present disclosure further provides an electronic device including a housing, a fan and a chip. The housing includes a main body and a supporting portion. The main body has an inner surface, an outer surface and an opening disposed on the outer surface. The inner surface forms a receiving space. The supporting portion is disposed on the inner surface, and is located in the receiving space. The supporting portion has a heat dissipating chamber that communicates with the opening. The fan is disposed in the heat dissipating chamber. The chip is disposed on the supporting portion, and is located in the receiving space.

In conclusion, since the fan or the heat sink fins of the present disclosure are disposed on the outer side of the housing, and the chip is connected to the housing, the assembly of the electronic device is simplified and the design time and the difficulty of the design of the electronic device decrease. Further, the heat dissipating efficiency of the electronic device increases.

BRIEF DESCRIPTION OF THE DRAWINGS

The disclosure can be more fully understood by reading the subsequent detailed description and examples with references made to the accompanying drawings, wherein.

DETAILED DESCRIPTION OF THE INVENTION

Figure 1:
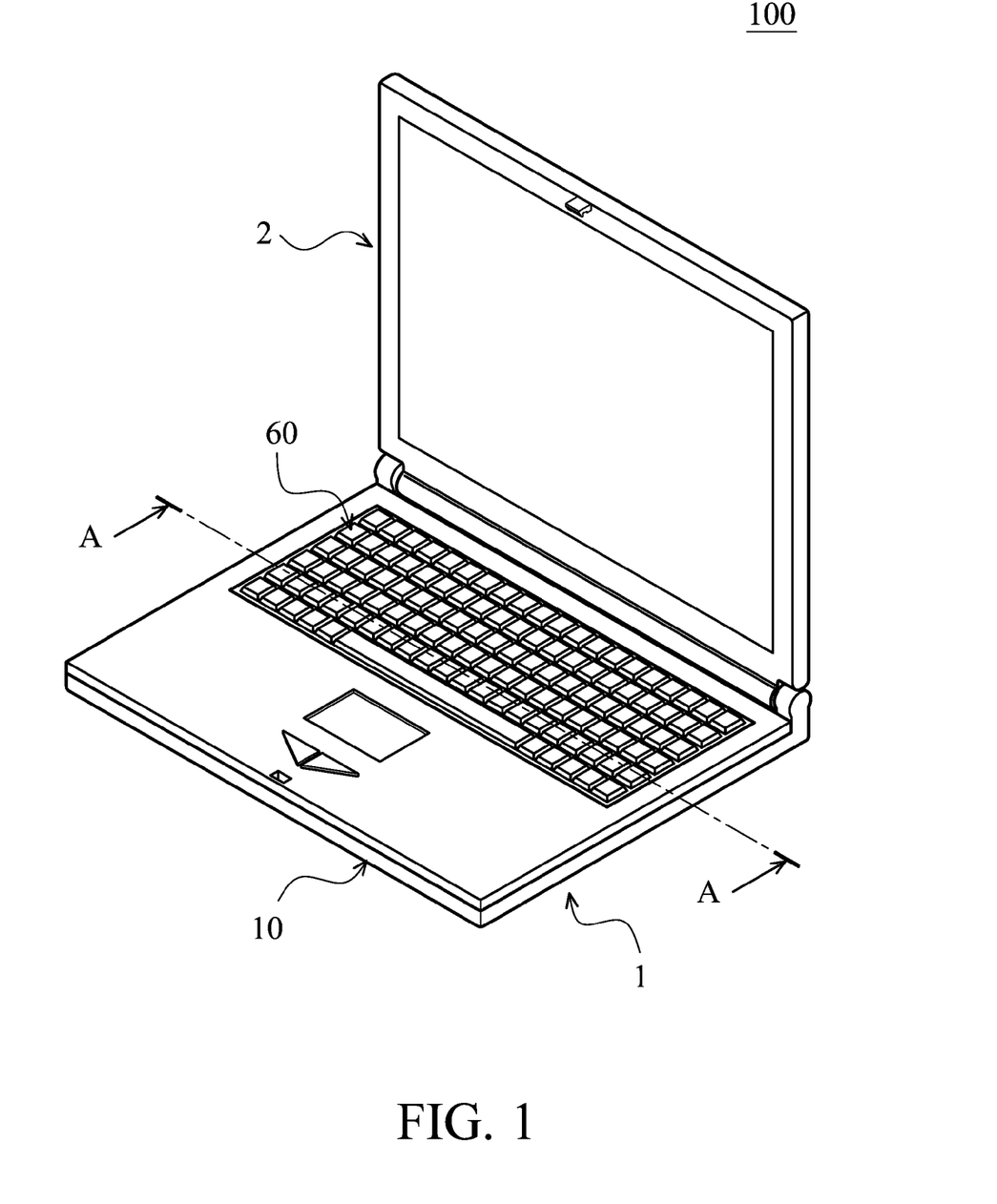
FIG. 1 is a perspective view of a first embodiment of an electronic device of the present disclosure.
Figure 2:
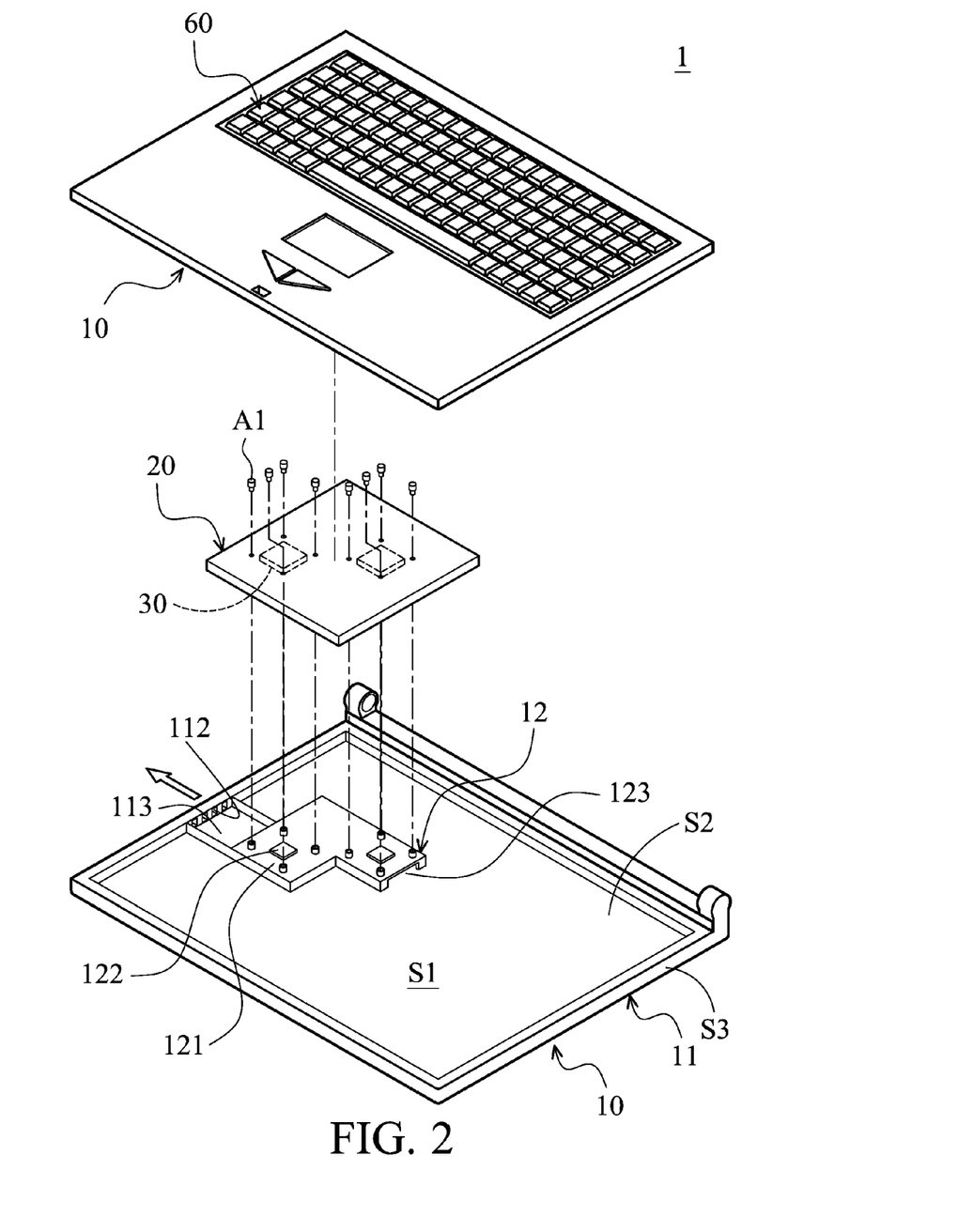
FIGS. 2 and 3 are exploded views of the first embodiment of the base of the present disclosure.
Figure 3:
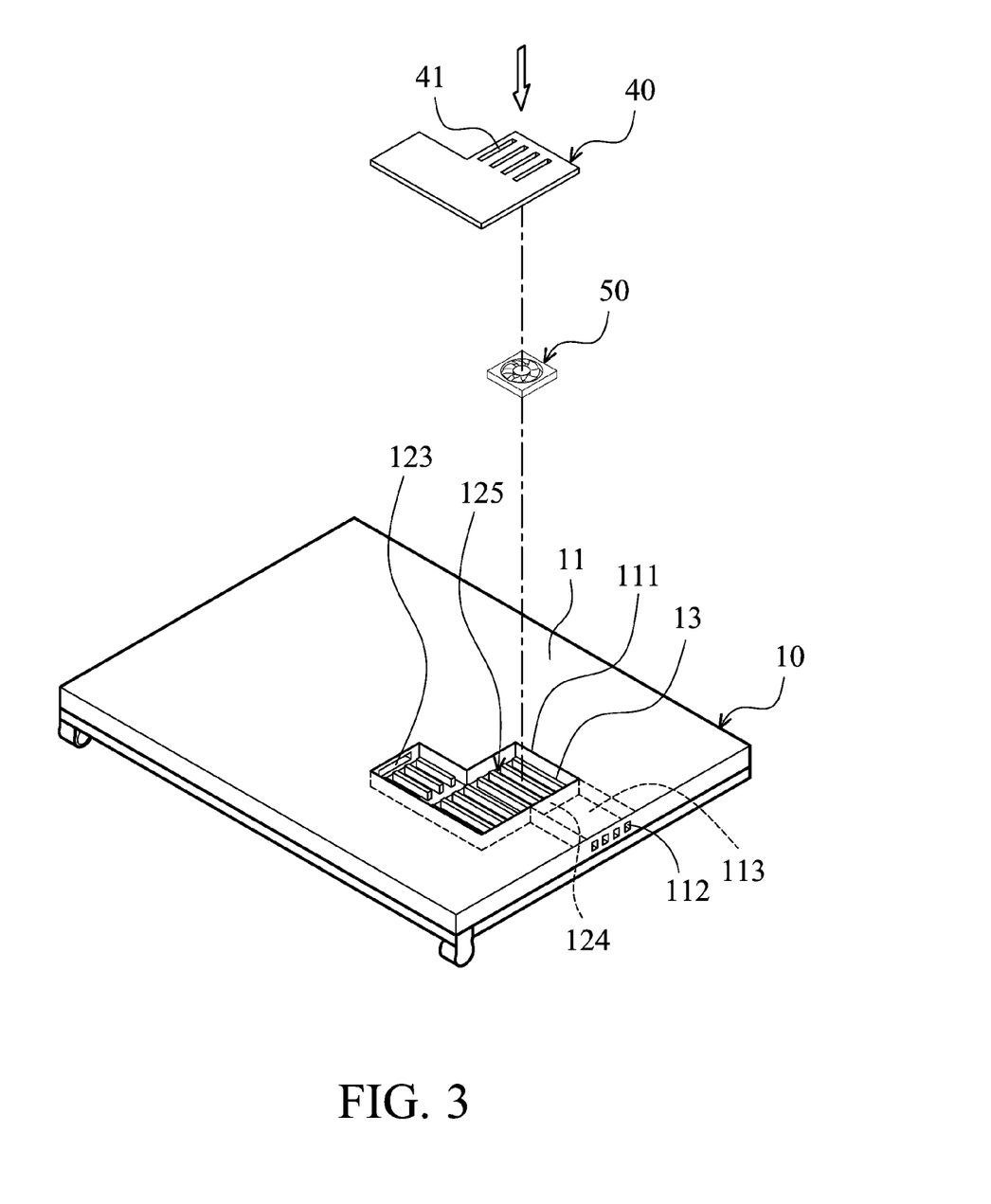
Figure 4:
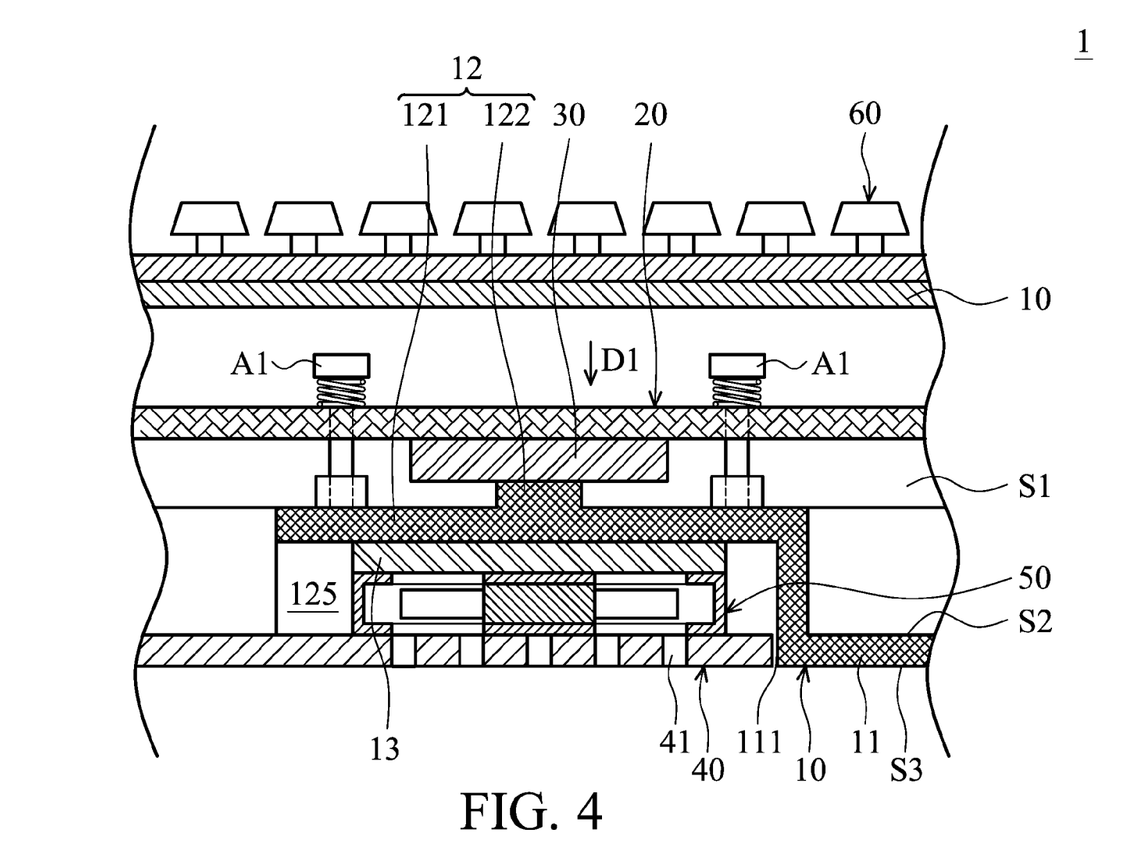
FIG. 4 is a cross-sectional view of cross-sectional line A-A in FIG. 1.

FIG. 1 is a perspective view of a first embodiment of an electronic device 100 of the present disclosure. FIGS. 2 and 3 are exploded views of the first embodiment of the base 1 of the present disclosure. FIG. 4 is a cross-sectional view of cross-sectional line A-A in FIG. 1. As shown in FIG. 1, the electronic device 100 may be a notebook computer. The electronic device 100 includes a base 1 and a display 2. The display 2 pivots on the base 1.

As shown in FIGS. 2 and 3, the base 1 includes a housing 10, a circuit board 20, a chip 30, a blocking plate 40, a fan 50 and a keyboard module 60. The housing 10 is made from alumina or an aluminum alloy. The housing 10 includes a main body 11, a supporting portion 12 and a plurality of heat sink fins 13 formed by stamping. In the embodiment, the elements, such as the main body 11, the supporting portion 12, the heat sink fins 13, and the fan 50, may be formed as a heat sink structure, and the main body 11, the supporting portion 12, and the heat sink fins 13 may be formed as a single piece to simplify the assembly process.

The main body 11 has a receiving space S1, an inner surface S2, an outer surface S3, an opening 111, a dissipating hole 112 and a flow channel 113. The receiving space S1 is located in the main body 11. The inner surface S2 is also located in the main body 11 and forms the receiving space S1. The opening 111 is disposed on the outer surface S3, and is located on the bottom of the main body 11. The dissipating hole 112 passes through the main body 11, and communicates with the flow channel 113.

The supporting portion 12 is disposed on the inner surface S2 of the main body 11, and is located in the receiving space S1. The supporting portion 12 includes a protrusion body 121, a heat conduction bump 122, an inlet hole 123, an outlet hole 124 and a heat dissipating chamber 125. The heat conduction bump 122 is disposed on the top of the protrusion body 121, and corresponds to the chip 30. The inlet hole 123 and the outlet hole 124 are respectively disposed on the sidewall of the protrusion body 121. The receiving space S1 communicates with the inlet hole 123. The heat dissipating chamber 125 communicates with the opening 111 of the main body 11, and communicates with the inlet hole 123 and the outlet hole 124. The flow channel 113 communicates with the outlet hole 124 and the dissipating hole 112.

The heat sink fins 13 are a plate structure, separately disposed on the supporting portion 12, and located in the heat dissipating chamber 125.

The circuit board 20 may be a main board disposed in the receiving space S1. The chip 30 may be a central processing chip 30 or a display chip 30 disposed on the circuit board 20, and located in the receiving space S1. The circuit board 20 may be fastened on the supporting portion 12 via locking elements A1, such as screws. When the circuit board 20 is disposed on the supporting portion 12, the chip 30 is connected to the heat conduction bump 122 of the supporting portion 12. Therefore, the heat generated by the chip 30 is transmitted to the entire housing 10 and the heat sink fins 13, and the heat dissipating efficiency of the electronic device 100 increases. Moreover, the heat conduction bump 122 may accurately contact the chip 30 by adjusting the height of the heat conduction bump 122.

In the embodiment, since the chip 30 and the heat sink fins 13 are located at two opposite sides of the supporting portion 12, the path of the heat generated by the chip 30 and transmitted to the heat sink fins 13 is shorter. Moreover, the circuit board 20, the chip 30, the heat conduction bump 122, the protrusion body 121, the heat sink fins 13, and the fan 50 are stacked along a stacking direction D1 in sequence, and the heat dissipating efficiency increases.

The blocking plate 40 is disposed on the bottom of the main body 11 and covers the opening 111. The blocking plate 40 has a plurality of open holes 41 corresponding to the fan 50. The fan 50 may be an axial flow fan or a centrifugal fan. The fan 50 is disposed on a side of the heat sink fins 13, and is located in the heat dissipating chamber 125. The keyboard module 60 is disposed on the top of the main body 11.

In the embodiment, the fan 50 is an axial flow fan. The fan 50 is directly disposed on the top of the heat sink fins 13. When the fan 50 rotates, the fan 50 draws air from open holes 41, and generates air flow directly to the heat sink fins 13. Thus, the air flow with the heat of the heat sink fins 13 flows through the flow channel 113 and the outlet hole 124 to the dissipating hole 112, and is exhausted through the dissipating hole 112. Further, since the fan 50 and the heat sink fins 13 are located in the heat dissipating chamber 125, the heat dissipating efficiency of the electronic device 100 increases.

In another embodiment, the heat generated by the chip 30 is lower, and the fan 50 (and the blocking plate 40) may be omitted. The heat of the heat sink fins 13 is dissipated by the heat dissipating chamber 125. In another embodiment, the heat sink fins 13 are omitted, and the fan 50 is disposed in the heat dissipating chamber 125.

Figure 5:
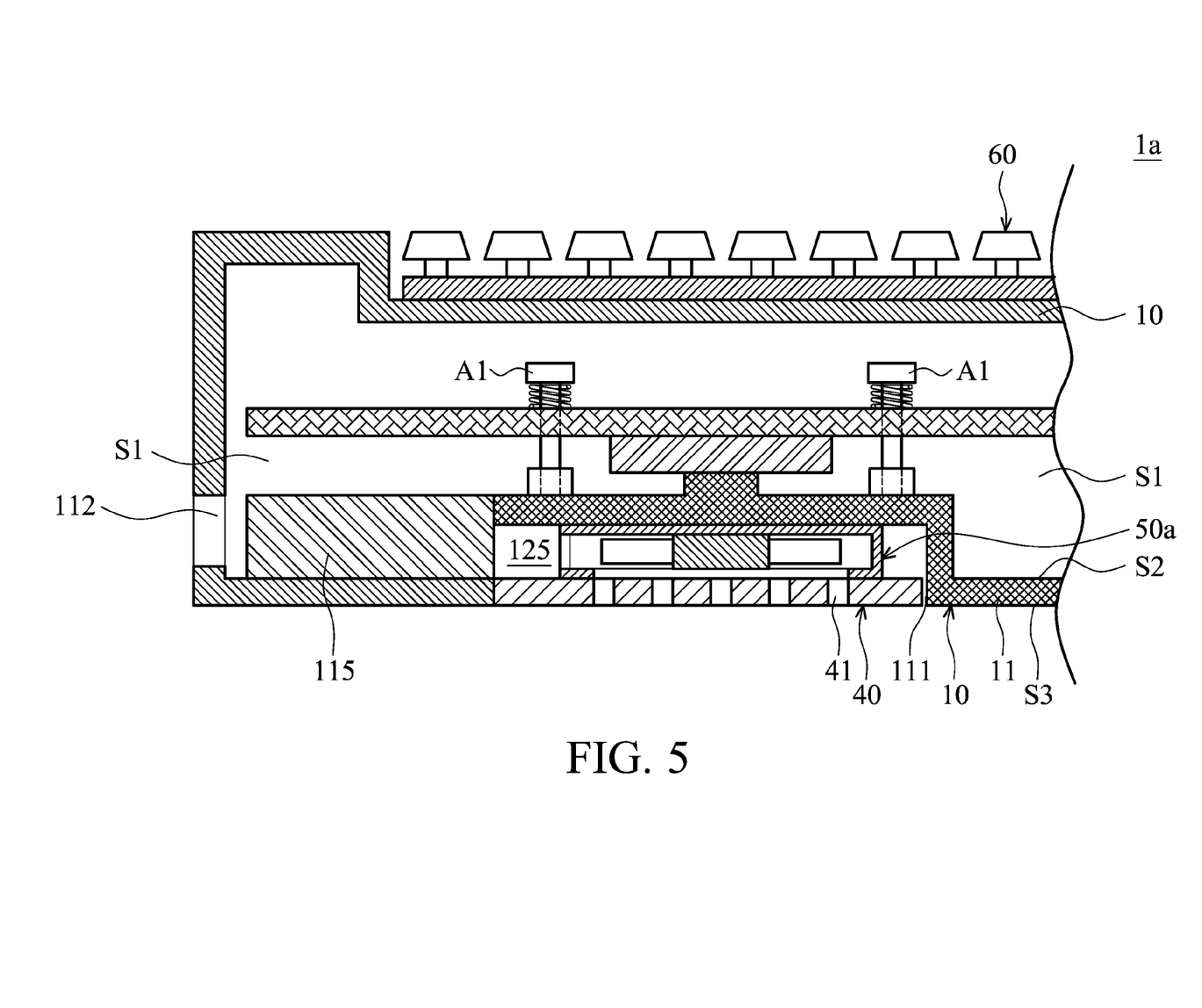
FIG. 5 is a cross-sectional view of a second embodiment of the base of the present disclosure.

FIG. 5 is a cross-sectional view of a second embodiment of the base 1a of the present disclosure. The main differences between the first embodiment and the second embodiment are described as follows. The heat sink fins 115 are disposed on the main body 11, and located in the flow channel 113 of the receiving space S1, and as a side of a fan 50a. The heat sink fins 115 and the main body 11 are formed as a single piece. Moreover, the fan 50a is a centrifugal fan. The fan 50a is disposed on the supporting portion 12, and located in the heat dissipating chamber 125 to decrease the thickness of the base 1a.

Figure 6:
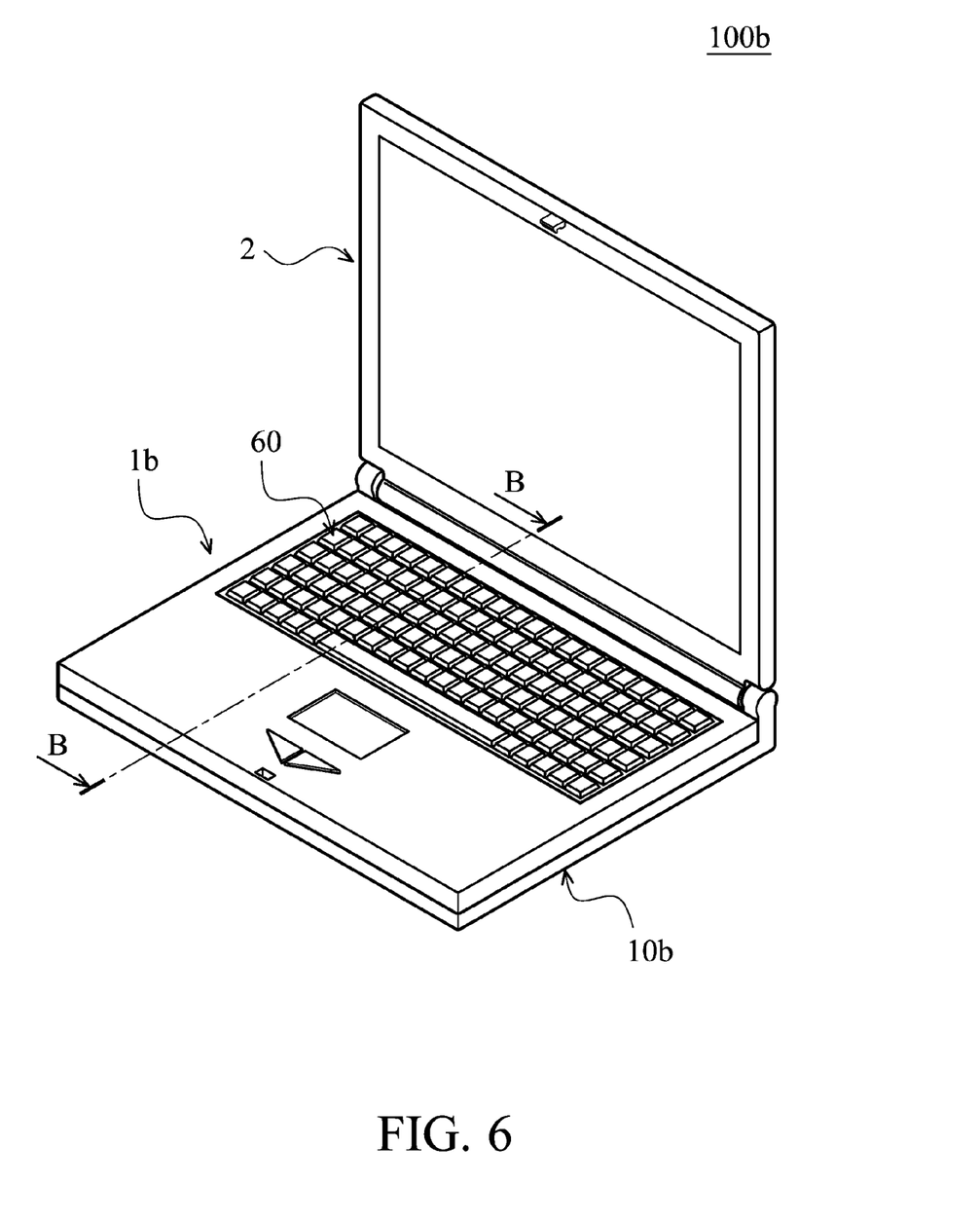
FIG. 6 is a perspective view of a third embodiment of an electronic device of the present disclosure.
Figure 7:
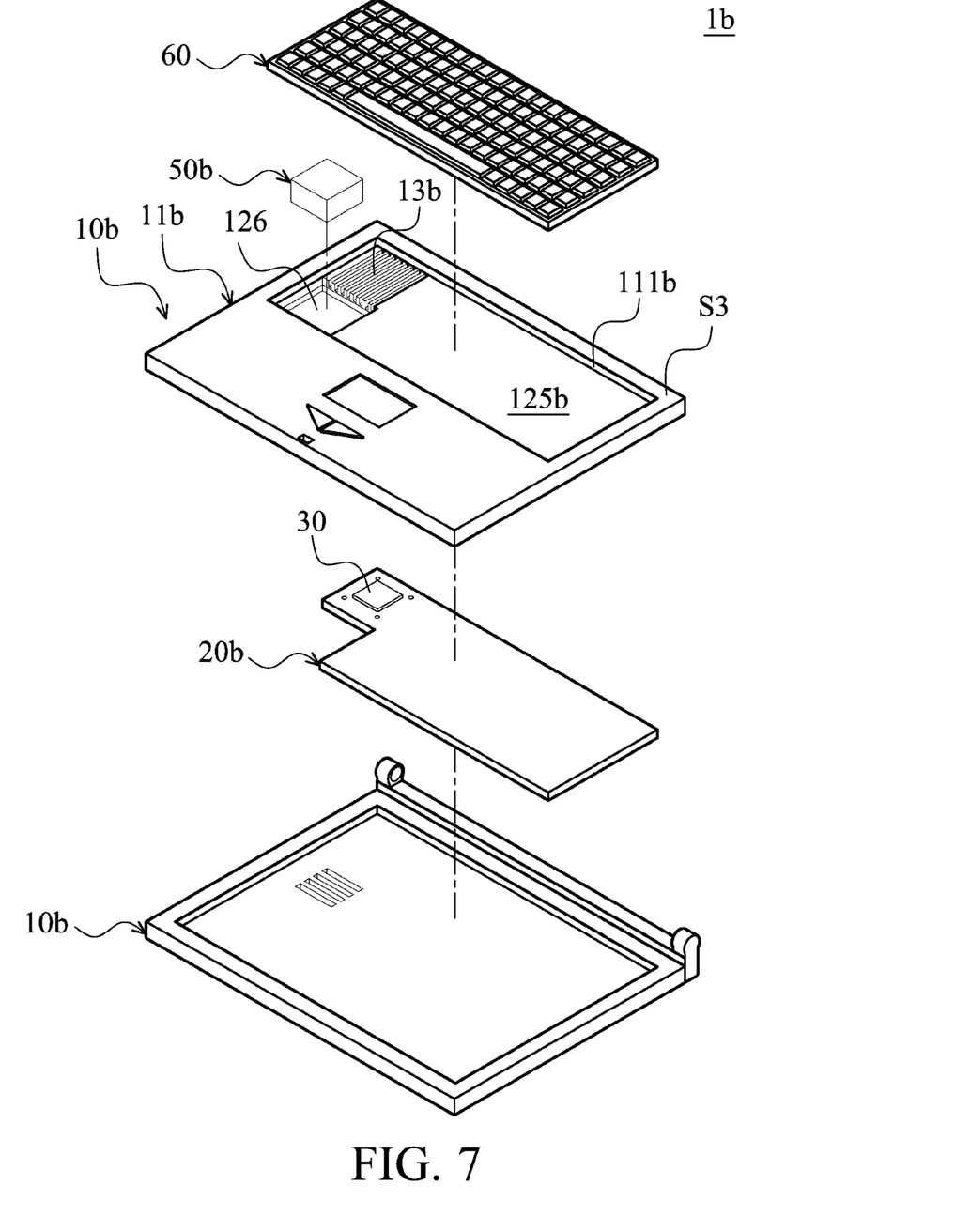
FIG. 7 is an exploded view of the third embodiment of the base of the present disclosure.
Figure 8:
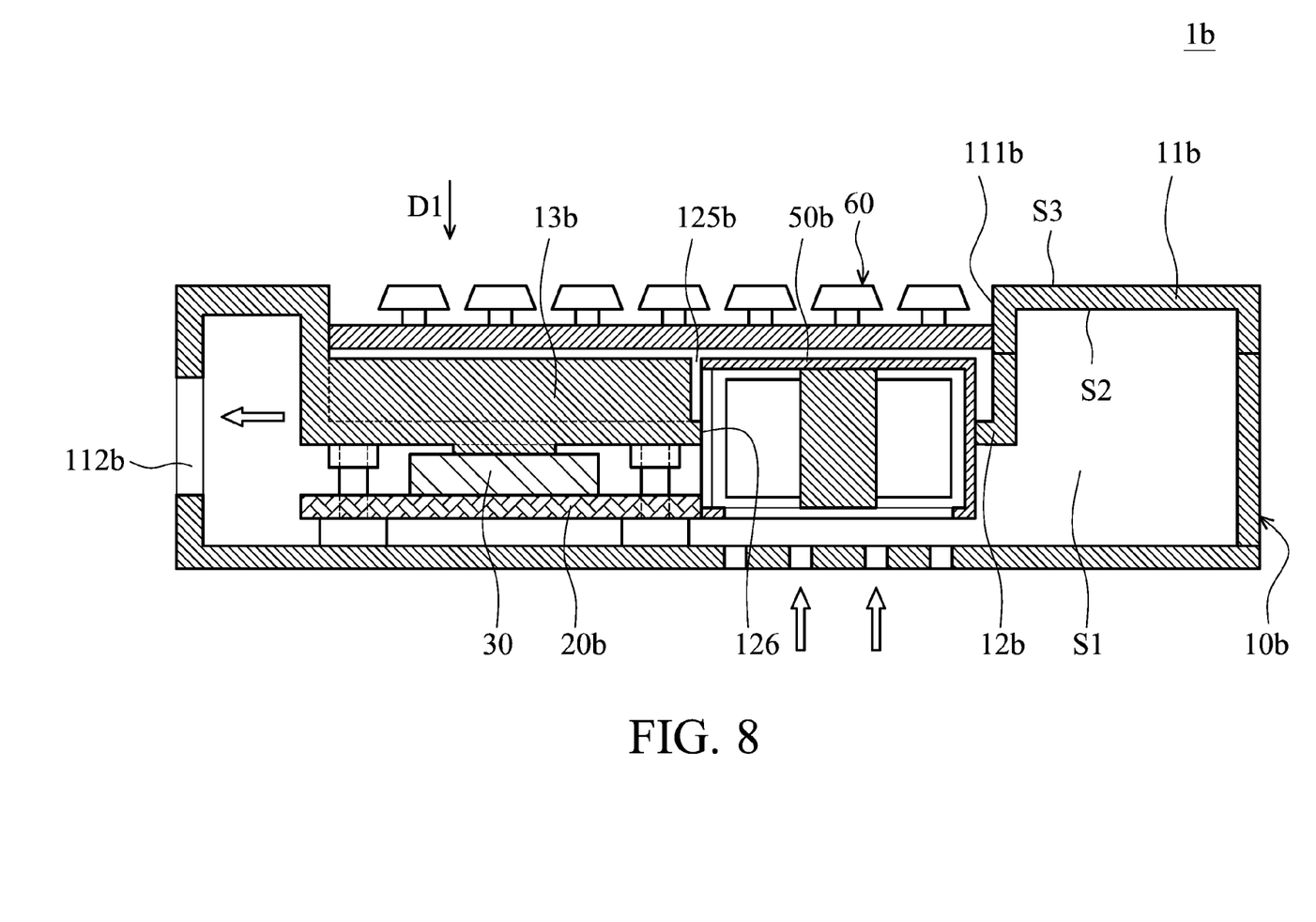
FIG. 8 is a cross-sectional view of BB cross-sectional line of FIG. 6.

FIG. 6 is a perspective view of a third embodiment of an electronic device 100b of the present disclosure. FIG. 7 is an exploded view of the third embodiment of the base 1b of the present disclosure. FIG. 8 is a cross-sectional view of BB cross-sectional line of FIG. 6. The main differences between the first embodiment and the third embodiment are described as follows. A supporting portion 12b is disposed on an inner surface S2 of the main body 11b of a housing 10b, and located in the receiving space S1. An opening 111b is located on the top of the main body 11b. Heat sink fins 13b are disposed on the supporting portion 12b, and are located in the heat dissipating chamber 125b. The chip 30 and the heat sink fins 13b are located at two opposite sides of the supporting portion 12b. The fan 50b is located in the heat dissipating chamber 125b, and disposed on a side of the heat sink fins 13b. In the embodiment, the fan 50b is a centrifugal fan near the sidewall of the heat sink fins 13b. The supporting portion 12b has a through hole 126 corresponding to the fan 50b.

The keyboard module 60 is disposed in the heat dissipating chamber 125b, and covers the heat sink fins 13b and the fan 50b. In the embodiment, the keyboard module 60, the heat sink fins 13b, the supporting portion 12b, the chip 30, and the circuit board 20b are stacked along the stacking direction D1 in sequence to decrease the thickness of the base 1b.

When the fan 50b rotates, the fan 50b draws the air in the receiving space S1 from the through hole 126 and generates air flow to the heat sink fins 13b to exhaust the heat of the heat sink fins 13b via the dissipating hole 112b.

Figure 9:
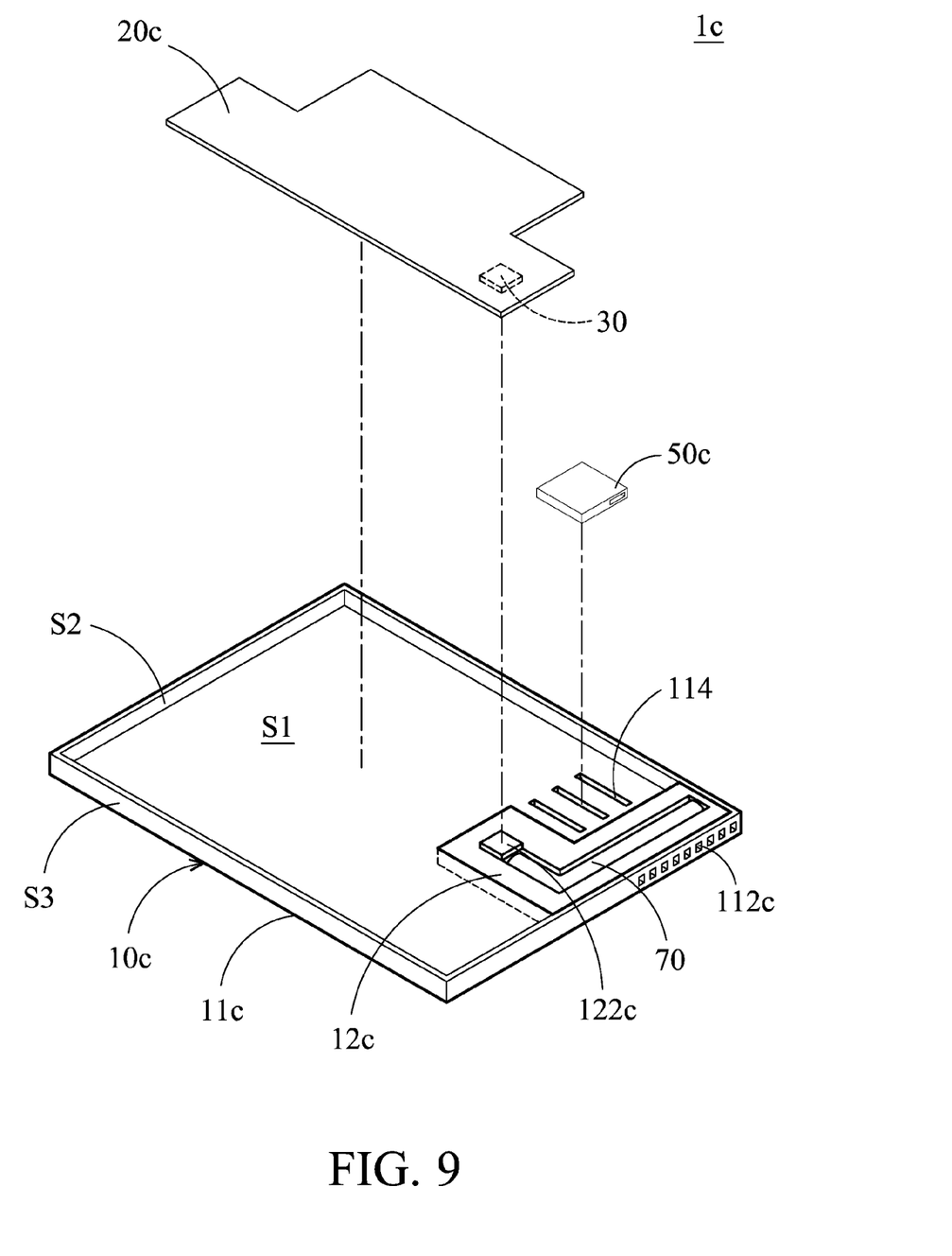
FIGS. 9 and 10 are exploded views of a fourth embodiment of the base of the present disclosure.
Figure 10:
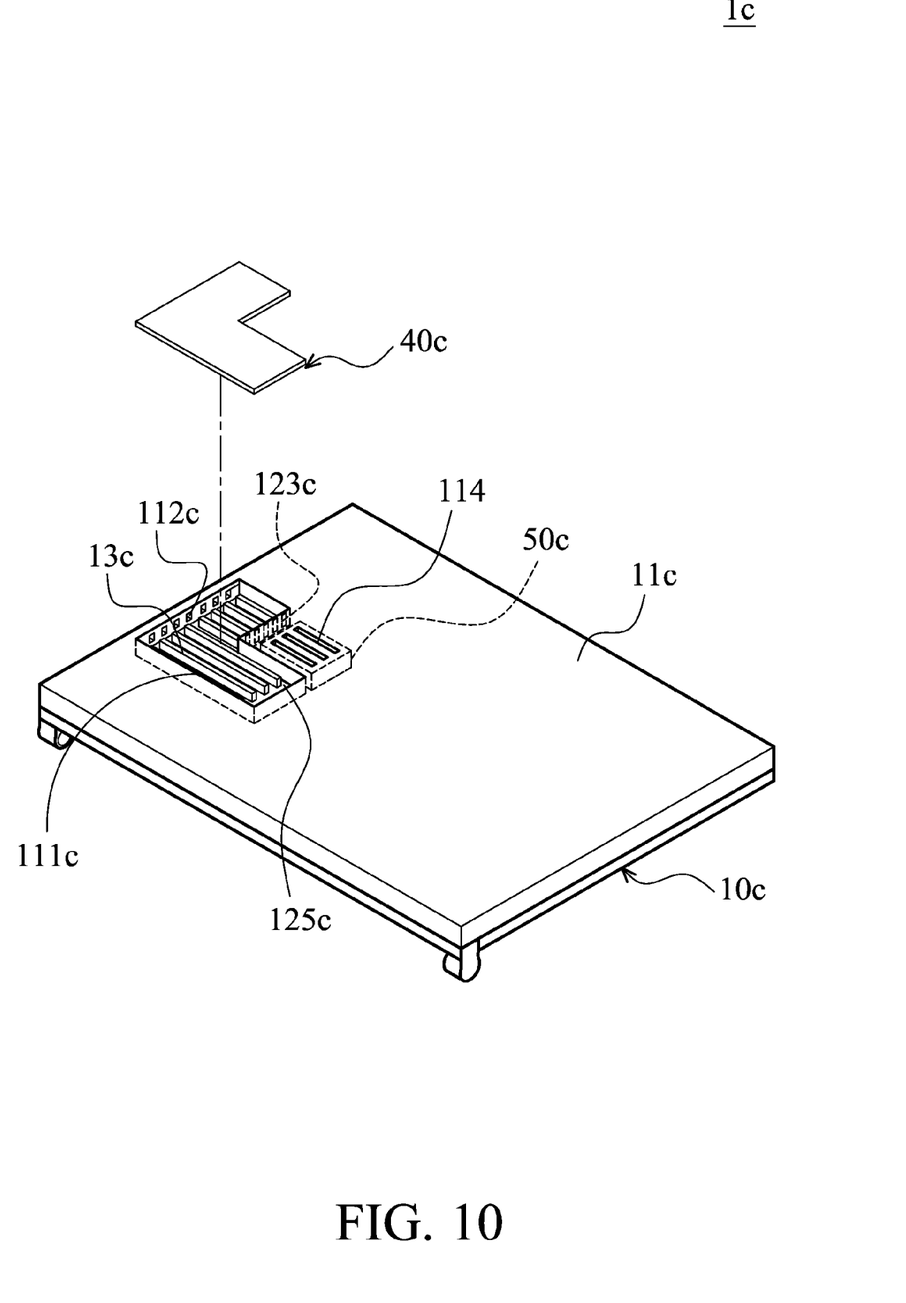

FIGS. 9 and 10 are exploded views of a fourth embodiment of the base 1c of the present disclosure. The main differences between the first embodiment and the fourth embodiment are described as follows. A fan 50c is a centrifugal fan disposed on a side of a heat sink fins 13c, and located in the receiving space S1. A main body 11c has a plurality of vent holes 114 corresponding to the fan 50c. The heat dissipating chamber 125c is located on the bottom of the main body 11c of the housing 10c and communicates with dissipating holes 112c. The heat sink fins 13c are disposed on the supporting portion 12c and located in the heat dissipating chamber 125c.

The base 1c further includes a heat pipe 70 disposed on the supporting portion 12c. An end of the heat pipe 70 is close to a heat conduction bump 122c and a chip 30 of the circuit board 20c, and the other end of the heat pipe 70 is close to the dissipating holes 112c and the fan 50c. The chip 30 is disposed on the heat conduction bump 122c. By the heat pipe 70 of the embodiment, the position of the chip 30 may not be limited.

When the fan 50c rotates, the fan 50c generates air flow to the heat sink fins 13c in the heat dissipating chamber 125c via inlet holes 123c, and the air flow with the heat of the heat sink fins 13c is exhausted through the dissipating hole 112c.

In conclusion, since the fan or the heat sink fins of the present disclosure are disposed on the outer side of the housing, and the chip is connected to the housing, the assembly of the electronic device is simplified and the design time and the difficulty of the design of the electronic device are decreased. Further, the heat dissipating efficiency of the electronic device is increased.

While the disclosure has been described by way of example and in terms of preferred embodiment, it is to be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   a housing, comprising:
      a main body having an inner surface, an outer surface, and an opening disposed on the outer surface, wherein the inner surface forms a receiving space;
      a supporting portion, disposed on the inner surface and located in the receiving space, wherein the supporting portion has a heat dissipating chamber that communicates with the opening; and
      a plurality of heat sink fins, disposed on the supporting portion and located in the heat dissipating chamber;
   a keyboard module, disposed in the heat dissipating chamber and covering the heat sink fins; and
   a chip, disposed on the supporting portion and located in the receiving space,
   wherein the chip and the heat sink fins are located at two opposite sides of the supporting portion, and the keyboard module, the heat sink fins, the supporting portion, and the chip are stacked along a stacking direction in sequence.

2. The heat sink structure as claimed in claim 1, wherein the main body and the supporting portion are formed as a single piece.

3. The heat sink structure as claimed in claim 1, wherein the heat sink fins and the supporting portion are formed as a single piece.

4. The heat sink structure as claimed in claim 3, further comprising a fan, disposed on a side of the heat sink fins and located in the heat dissipating chamber.

5. The heat sink structure as claimed in claim 3, further comprising a fan, disposed on a side of the heat sink fins and located in the receiving space.

6. The heat sink structure as claimed in claim 1, further comprising a fan disposed in the heat dissipating chamber.

7. The heat sink structure as claimed in claim 1, further comprising a heat pipe disposed on the supporting portion.

8. The heat sink structure as claimed in claim 1, further comprising a blocking plate covering the opening.

9. An electronic device, comprising:
   a housing, comprising:
      a main body having an inner surface, an outer surface and an opening disposed on the outer surface, wherein the inner surface forms a receiving space;
      a supporting portion, disposed on the inner surface and located in the receiving space, wherein the supporting portion has a heat dissipating chamber that communicates with the opening; and
      a plurality of heat sink fins, disposed on the supporting portion and located in the heat dissipating chamber;
   a keyboard module, disposed in the heat dissipating chamber and covering the heat sink fins;
   a circuit board disposed in the receiving space; and
   a chip, disposed on the circuit board and connected to the supporting portion,
   wherein the chip and the heat sink fins are located at two opposite sides of the supporting portion, and the keyboard module, the heat sink fins, the supporting portion, and the chip are stacked along a stacking direction in sequence.

10. The electronic device as claimed in claim 9, wherein the main body and the supporting portion are formed as a single piece.

11. The electronic device as claimed in claim 9, wherein the heat sink fins and the supporting portion are formed as a single piece.

12. The electronic device as claimed in claim 9, further comprising a fan, disposed on a side of the heat sink fins and located in the heat dissipating chamber.

13. The electronic device as claimed in claim 9, further comprising a fan, disposed on a side of the heat sink fins and located in the receiving space.

14. The electronic device as claimed in claim 9, further comprising a heat pipe disposed on the supporting portion.

15. The electronic device as claimed in claim 9, further comprising a blocking plate covering the opening.

16. An electronic device, comprising:
   a housing, comprising:
      a main body having an inner surface, an outer surface and an opening disposed on the outer surface, wherein the inner surface forms a receiving space; and
      a supporting portion, disposed on the inner surface and located in the receiving space, wherein the supporting portion has a heat dissipating chamber that communicates with the opening, and has a through hole;
   a fan, disposed in the through hole and located in the heat dissipating chamber and the receiving space; and
   a keyboard module, disposed in the heat dissipating chamber and covering the fan;
   a chip, disposed on the supporting portion, located in the receiving space,
   wherein the chip and the keyboard module are located at two opposite sides of the supporting portion.

17. The electronic device as claimed in claim 16, wherein the supporting portion and the main body are formed as a single piece.

18. The electronic device as claimed in claim 16, wherein the housing comprises a plurality of heat sink fins disposed on the main body and located in the receiving space at a side of the fan, wherein the heat sink fins and the main body are formed as a single piece.

19. The electronic device as claimed in claim 16, further comprising a heat pipe disposed on the supporting portion.

20. The electronic device as claimed in claim 16, further comprising a blocking plate covering the opening.

21. The electronic device as claimed in claim 16, further comprising a circuit board disposed on the chip, located in the receiving space.

* * * * *